US010241578B2

(12) United States Patent
Shibata et al.

(10) Patent No.: US 10,241,578 B2
(45) Date of Patent: Mar. 26, 2019

(54) OPERATION APPARATUS

(71) Applicant: DENSO CORPORATION, Kariya, Aichi-pref. (JP)

(72) Inventors: Syunsuke Shibata, Nishio (JP); Motoki Tachiiri, Nishio (JP); Masahiro Itoh, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/741,181

(22) PCT Filed: Jul. 5, 2016

(86) PCT No.: PCT/JP2016/069844
§ 371 (c)(1),
(2) Date: Dec. 29, 2017

(87) PCT Pub. No.: WO2017/014042
PCT Pub. Date: Jan. 26, 2017

(65) Prior Publication Data
US 2018/0196518 A1    Jul. 12, 2018

(30) Foreign Application Priority Data

Jul. 21, 2015  (JP) ................. 2015-144131

(51) Int. Cl.
*G06F 3/01* (2006.01)
*G06F 3/02* (2006.01)
(Continued)

(52) U.S. Cl.
CPC ............... *G06F 3/016* (2013.01); *G06F 3/02* (2013.01); *H01H 13/64* (2013.01); *H01H 36/00* (2013.01);
(Continued)

(58) Field of Classification Search
CPC .......... G06F 3/016; H03K 17/962; H03K 2217/960745; G02K 33/02; H02K 33/02
(Continued)

(56) References Cited

U.S. PATENT DOCUMENTS

2006/0055515 A1*  3/2006  Yatsu ............... G09B 21/004
                                                       340/407.2
2014/0218324 A1*  8/2014  Tissot ................ B60K 37/06
                                                       345/173

FOREIGN PATENT DOCUMENTS

JP        2014524605 A    9/2014

* cited by examiner

*Primary Examiner* — Qutbuddin Ghulamali
(74) *Attorney, Agent, or Firm* — Harness, Dickey & Pierce, P.L.C.

(57) ABSTRACT

An operation apparatus includes: an operation plate having an operation surface performed by a pressing operation with an operation body; a vibrator including a movable yoke and a fixed yoke for generating a magnetic circuit for guiding a magnetic flux, and an exciting coil for generating the magnetic flux, and the vibrator vibrating the operation plate through a magnetic force generated by an electrical conduction on the exciting coil; a detector detecting a pressing amount by the pressing operation; a press determinator determining based on the pressing amount detected by the detector whether the pressing operation is performed; and a vibration controller for an electrical conduction on the exciting coil when the press determinator determines that the pressing operation is performed. The detector detects the pressing amount by detecting a change in an electrostatic capacitance generated between the movable yoke and the fixed yoke.

3 Claims, 4 Drawing Sheets

(51) Int. Cl.
*H01H 13/64* (2006.01)
*H01H 36/00* (2006.01)
*H03K 17/96* (2006.01)
*H03K 17/975* (2006.01)

(52) U.S. Cl.
CPC ......... *H03K 17/962* (2013.01); *H03K 17/975* (2013.01); *H03K 2217/96062* (2013.01); *H03K 2217/960745* (2013.01)

(58) Field of Classification Search
USPC .................................................. 340/407.2
See application file for complete search history.

OPERATION APPARATUS

CROSS REFERENCE TO RELATED APPLICATIONS

This application is a U.S. National Phase Application under 35 U.S.C. 371 of International Application No. PCT/JP2016/069844 filed on Jul. 5, 2016 and published in Japanese as WO 2017/014042 A1 on Jan. 26, 2017. This application is based on and claims the benefit of priority from Japanese Patent Application No. 2015-144131 filed on Jul. 21, 2015. The entire disclosures of all of the above applications are incorporated herein by reference.

TECHNICAL FIELD

The present disclosure relates to an operation apparatus, which is operated by pressing an operation surface of an operation plate.

BACKGROUND ART

Patent Literature 1 describes that an operation apparatus, which is operated by pressing an operation surface of an operation plate with a user's fingertip (operation body), includes a vibration device for vibrating the operation plate. Patent Literature 1 further describes that the detection of a contact operation is notified to the user when the vibration device is activated in a situation where the contact operation is detected.

PRIOR ART LITERATURES

Patent Literature

Patent Literature 1: JP 2014-524605 A

SUMMARY OF INVENTION

The inventors considered to add the function of vibrating notification to an operation apparatus, which operated by pressing an operation surface of an operation plate, in view of the above-mentioned conventional operation apparatus. For example, when it is detected that the pressing amount caused by a pressing operation is larger than or equal to a predetermined amount, the vibration device is activated and the detection of the pressing operation is notified to a user.

However, if the function of vibrating function is added as described above, the number of components for configuring the operation apparatus becomes larger.

An object of the present disclosure is to provide an operation apparatus that has a vibrating notification function while inhibiting an increase in the number of components.

An operation apparatus according to a first aspect of the present disclosure includes: an operation plate having an operation surface, which is performed by a pressing operation with an operation body; a vibrator that includes a movable yoke and a fixed yoke that generate a magnetic circuit for guiding a magnetic flux, and an exciting coil that generates the magnetic flux, and the vibrator that vibrates the operation plate through a magnetic force generated by an electrical conduction on the exciting coil; a detector that detects a pressing amount, which is caused by the pressing operation; a press determinator that determines based on the pressing amount detected by the detector whether the pressing operation is performed; and a vibration controller that performs an electrical conduction on the exciting coil when the press determinator determines that the pressing operation is performed. In addition, the detector detects the pressing amount by detecting a change in an electrostatic capacitance generated between the movable yoke and the fixed yoke.

According to the above-mentioned operation apparatus, it is particularly focused that the electrostatic capacitance formed between the movable yoke and the fixed yoke included in the vibrator changes when the pressing operation is performed. The pressing amount used for determination performed by the press determinator is detected by detecting a change in the electrostatic capacitance. Accordingly, since the pressing amount is detected by detecting a change in the electrostatic capacitance formed between a pair of electrodes, it is not necessary to include an additional electrode only used for detecting the pressing amount. The movable yoke and the fixed yoke included in the vibrator can function as the above-mentioned electrode. Accordingly, since an additional electrode is not needed, an increase in number of components can be restricted while a vibrating notification function can be provided.

An operation apparatus according to a second aspect of the present disclosure includes: an operation plate that includes an operation surface, which is performed by a pressing operation with an operation body; a vibrator that includes a movable yoke and a fixed yoke that generate a magnetic circuit for guiding a magnetic flux, and an exciting coil that generates the magnetic flux, and the vibrator that vibrates the operation plate through a magnetic force generated by an electrical conduction on the exciting coil; a detector that detects a pressing amount, which is caused by the pressing operation; a press determinator that determines based on the pressing amount detected by the detector whether the pressing operation is performed; a vibration controller that performs an electrical conduction on the exciting coil when the press determinator determines that the pressing operation is performed; and a voltage application device that applies a detected voltage to the movable yoke. In addition, the detector detects the pressing amount by detecting a change in an inductance of the exciting coil when the detected voltage is applied.

According to the above-mentioned operation apparatus, it is particularly focused that an inductance in the exciting coil included in the vibrator changes when the pressing operation is performed. The pressing amount used for determination performed by the press determinator is detected by detecting a change in the inductance. Accordingly, since the pressing amount is detected by detecting a change in the inductance of the coil, it is not necessary to include an additional coil only used for detecting the pressing amount. Since the exciting coil included in the vibrator is utilized, an increase in number of components can be restricted while a vibrating notification function can be provided.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
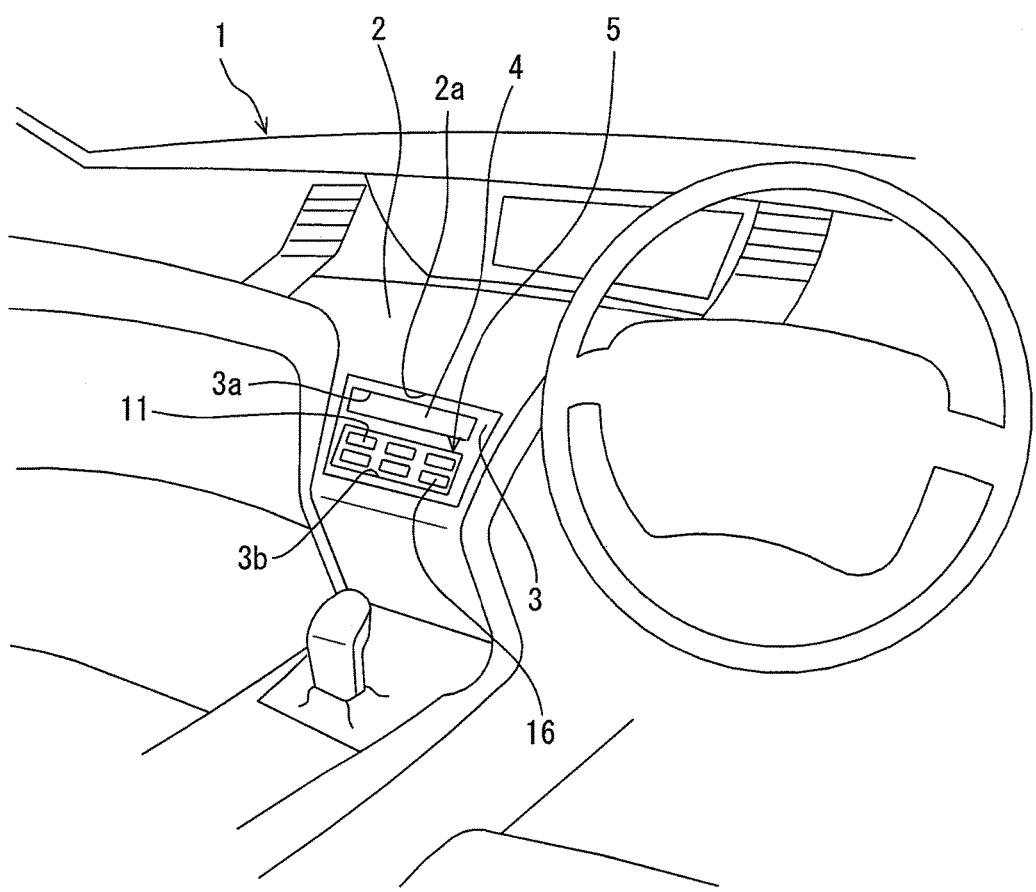
FIG. 1 is a perspective view that illustrates a mounting position of an operation apparatus in a vehicle according to a first embodiment of the present disclosure.

The following describes a plurality of embodiments for carrying out an operation apparatus according to the present disclosure with reference to the drawings. In some embodiments, the repetitive descriptions for some parts, which are appended by the same reference numerals and described in a preceding embodiment, are omitted. In some embodiments, in a case where only one part of the configuration is described, with regard to the other parts of the configuration, it is applicable to refer to other embodiments which are previously described.

First Embodiment

FIG. 1 is a perspective view that illustrates an instrumental panel 2 mounted to a vehicle 1 which is seen from a compartment. A display device 4 and an operation apparatus 5 are mounted to a central portion of the instrumental panel 2 in a vehicular left-and-right direction. In particular, a panel 3 is mounted to an opening 2a formed at the instrumental panel 2. The display surface of the display device 4 and the front surface of the operation apparatus 5 are exposed from the opening 2a formed at the panel 3. The display device 4 displays a content set by a vehicle passenger as a user who operates the operation apparatus 5.

Figure 2:
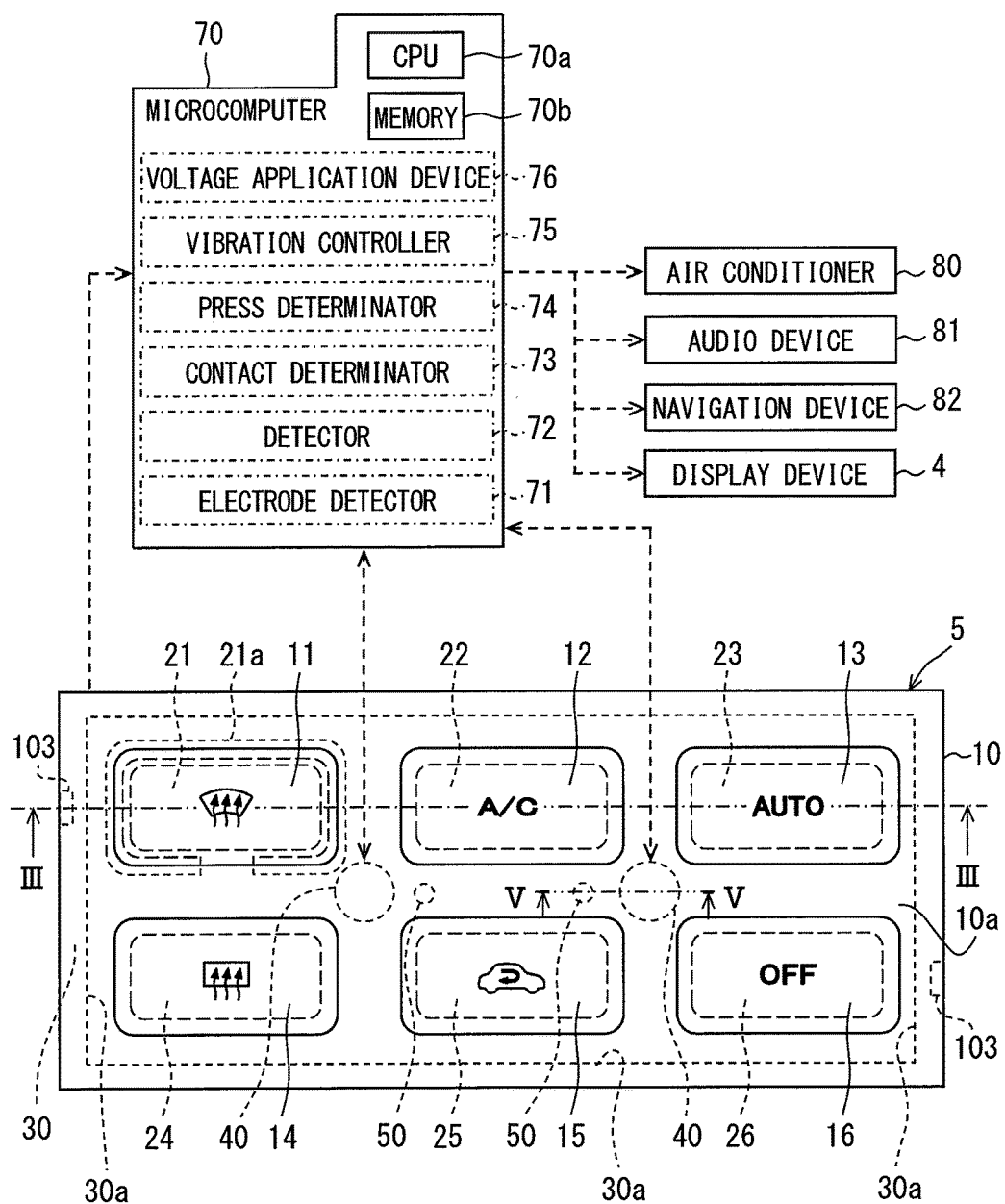
FIG. 2 is a front view that illustrates the operation apparatus shown in FIG. 1.
Figure 3:
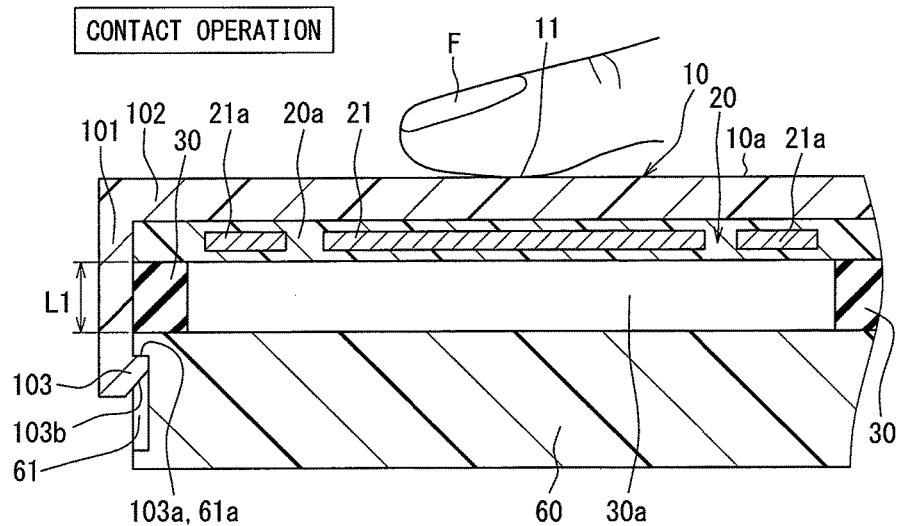
FIG. 3 is a cross sectional view taken along the III-III line shown in FIG. 2, and illustrates a state in which a contact operation is performed.

As shown in FIGS. 2 and 3, the operation apparatus 5 includes: an operation plate 10, an electrode sheet 20, a pressing elastic member 30, a vibrator 40, an assembly member 60 and a microcomputer 70.

The operation plate 10 is a member made of resin, and is formed in a bottomed cylindrical body having a cylindrical part 101 and a bottom part 102. A decorated surface 10a is formed at the bottom part 102 which is visually recognized by a user. The decorated surface 10a includes a plurality of operation surfaces 11, 12, 13, 14, 15 and 16. Characters, signs figures or the like, which represent a setting content for an operation target, are printed on these operation surfaces 11 to 16. In an example illustrated in FIG. 1, the operation target is an air conditioner 80 for ventilation of the compartment. For example, the activation, setting the air flow amount and temperature for the air conditioner 80 are particular examples the above setting contents. The cylindrical part 101 has a cylindrical shape extended from the periphery of the bottom part 102 to a side, which is opposite to the decorated surface 10a. An extended end part of the cylindrical part 101 is mounted to the assembly member 60 made of resin. The configuration of this assembly is described hereinafter.

When a user performs a contact operation by touching the operation surfaces 11 to 16 with a fingertip F, the corresponding setting content may be changed. For example, it is configured that an image of content for notifying which one of the operation surfaces is selected by a contact operation on the plurality of operation surfaces 11 to 16 to be displayed on the display device 4. When a setting change is caused by the contact operation, an alarm sound is generated for notifying the matter. In a state where the setting can be changed, when a user performs a pressing operation on the operation surfaces 11 to 16 with the fingertip F, the corresponding setting content is changed. For example, when the contact operation is performed on the operation surface 13, the setting of the automatic control of the air conditioner 80 can be changed, and the on/off setting of automatic control can be switched when the pressing operation is performed on the operation surface 13. For example, when the automatic control is switched to an on setting, a command signal for commanding this operation is outputted to the air conditioner 80 from the microcomputer 70, and then the switching of the air supply or air flow amount of ventilated air is automatically controlled.

The electrode sheet 20 is pasted at the surface of the operation plate 10 opposite to the decorated surface 10a. The electrode sheet 20 has a plurality of electrodes 21, 22, 23, 24, 25, 26 and a ground electrode 21a. The electrodes 21 to 26 and the ground electrode 21a are held by a resin-made sheet 20a. The electrodes 21 to 26 are arranged at respective positions, which are opposite to the corresponding operation surfaces 11 to 16. The ground electrode 21a is formed in a shape that extends along the periphery of the electrodes 21 to 26. FIG. 2 illustrates the ground electrode 21a that extends along the periphery of the electrode 21, and the illustration of the ground electrode along the other electrodes 22 to 26 is omitted.

At the opposite side of the operation plate 10 with respect to the electrode sheet 20, the assembly member 60 is arranged to be separated from the operation plate 10 with only a predetermined distance. The pressing elastic member 30 is arranged between the electrode sheet 20 and the assembly member 60. The predetermined distance corresponds to the thickness L of the pressing elastic member 30. The pressing elastic member 30 is made of material having elasticity such as sparkling resin or rubber.

The pressing elastic member 30 has a shape that extends in a circular shape around the periphery of the decorated surface 10a and has an opening part 30a formed in a round shape inside. The shape and the position of the pressing elastic member 30 are set so that the operation surfaces 11 to 16 are positioned at the opening part 30a as viewed from the decorated surface 10a (operation side) with respect to the operation plate 10. In other words, the pressing elastic member 30 is arranged outside of the region overlapping with the operation surface 11 viewed in a pressing operation direction.

Between the bottom part 102 and the assembly member 60, the electrode sheet 20 and the pressing elastic member 30 are stacked in an extending direction of the cylindrical part 101 (the up-down direction illustrated in FIG. 3). In other words, the electrode sheet 20 and the pressing elastic member 30 are stacked and accommodated in an accommodation space arranged inside the operation plate 10 and the assembly member 60. The pressing elastic member 30 is accommodated in a state where the pressing elastic member 30 is elastically deformed in a stacking direction. The both surfaces of the pressing elastic member 30 are adhered to the electrode sheet 20 and the assembly member 60 with an adhesive agent.

The following describes a configuration of assembling the operation plate 10 and the assembly member 60 in detail. An engaging part 103 having an engaging surface 103a is provided at several locations of the cylindrical part 101 at the extended tip. An engaging hole 61, which is configured to be fitted by the engaging part 103, is arranged at a part of the side surface of the assembly member 60 to be opposite to the engaging part 103. With regard to the situation illustrated in FIG. 3, it is prevented that the engaging part 103 gets out from the engaging hole 61 by engaging the engaging surface 103a of the engaging part 103 to the target engaging surface 61a of the engaging hole 61 against the elastic forces exerted by the pressing elastic member 30.

When the operation plate 10 is assembled with the assembly member 60, in a situation where a taper surface 103b of the engaging part 103 is pressed to the corner part of the assembly member 60, the operation plate 10 is pressed in the stacking direction to the assembly member 60. Accordingly, the cylindrical part 101 deforms elastically in a direction in which the opening of the plate 10 is pressed and widen in a predetermined direction, and the engaging part 103 fits into the engaging hole 61.

Figure 4:
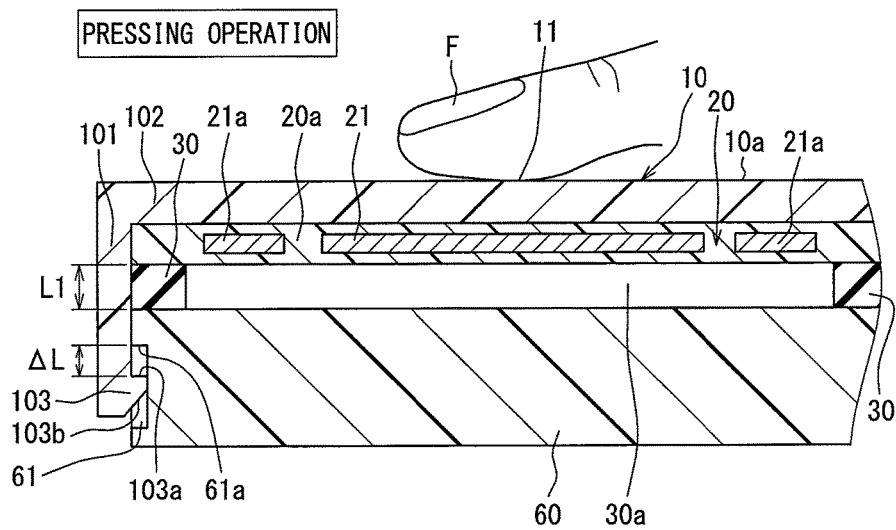
FIG. 4 is a cross sectional view that illustrates a state in which a pressing operation is performed at the operation apparatus according to the first embodiment.

FIG. 3 illustrates a situation in which a user's fingertip F (operation body) is in contact with the operation surface 11, in other words, a situation of having a contact operation. This situation remains an initial state in which the engaging surfaces 103a and 61a are abutted to each other. When the fingertip F performing a contact operation is further doing a pressing operation by pressing against the decorated surface 10a in a perpendicular direction, in other words, by pressing to the rear side in the stacking direction, the operation plate 10 moves toward the rear side relative to the assembly member 60 in the pressing direction as illustrated in FIG. 4. In particular, FIG. 4 illustrates a situation in which the engaging surface 103a moves away from the engaging surface 61a and the engaging part 103 moves into the engaging hole 61 when the pressing elastic member 30 is further elastically deformed and the operation surface 10 is pressed. The separation distance between the engaging surface 103a and the engaging surface 61a corresponds to a pressing amount ΔL caused by the pressing operation. The difference between the thickness L of the pressing elastic member 30 at the time of the contact operation and the thickness L of the pressing elastic member 30 at the time of pressing operation is the amount of deformation in a situation where the pressing elastic member 30 is elastically deformed by having the pressing operation.

When the contact operation is performed, an electrostatic capacitance C1, which is formed between the electrodes 21 to 26 and the fingertip F, changes. When the pressing operation is performed, an electrostatic capacitance C2, which is formed between a movable yoke 41 and a fixed yoke 42, changes.

Figure 5:
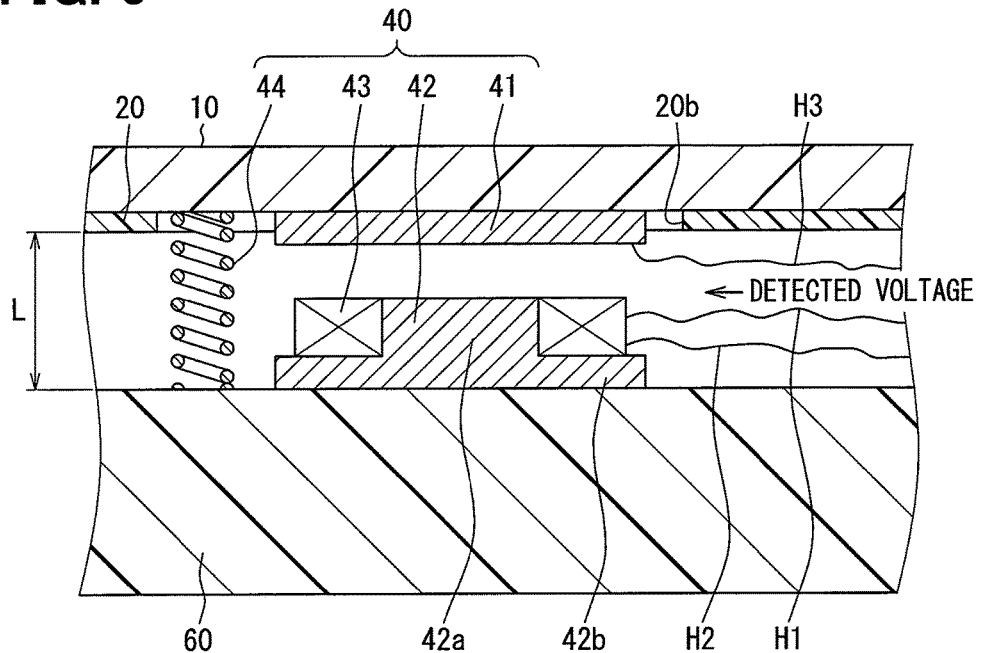
FIG. 5 illustrates a cross sectional view taken along a V-V line shown in FIG. 2.

As illustrated in FIG. 5, the vibrator 40 includes the movable yoke 41, the fixed yoke 42, an exciting coil 43 and a vibrating elastic member 44. The exciting coil 43 generates a magnetic flux through electrical conduction. The movable yoke 41 and the fixed yoke 42 forms a magnetic circuit for guiding the magnetic flux through the electrical conduction of the exciting coil 43. Accordingly, a magnetic force attracted to the fixed yoke 42 acts on the movable yoke 41.

The movable yoke 41 is formed in a circular-plate shape viewed in a direction of the pressing operation (see FIG. 2). The fixed yoke 42 includes a main part 42a and a circuit plate part 42b. The main part 42a is formed in a circular cylindrical shape where the exciting coil 43 is wound. A predetermined gap is formed between the main part 42a and the movable yoke 41. The gap becomes smaller when the pressing operation is performed. The circular plate part 42b is formed in a plate shape that is parallel to the movable yoke 41 from the end part of the main part 42a which is opposite to the movable yoke 41, and is arranged at a position overlapping with the movable yoke 41 viewed in a direction of the pressing operation. The circular plate part 42b is formed in a circular shape having a diameter similar to the diameter of the movable yoke 41.

The vibrating elastic member 44 is a coil spring that is compressed and deformed in a stacking direction. The vibrating elastic member 44 has one end assembled with the operation plate 10, and has another end assembled with the assembly member 60. The movable yoke 41 is assembled with the operation plate 10, and the fixed yoke 42 is assembled with the assembly member 60. Accordingly, when the exciting coil 43 is temporarily under electrical conduction, the movable yoke 41 is attracted to the fixed yoke 42, and the operation plate 10 moves closer to the assembly member 60 so as to minimize the thickness L of the pressing elastic member 30. In other words, the operation plate 10 moves closer to the assembly member 60 so as to be against the elastic force exerted by the pressing elastic member 30. The vibrating elastic member 44 is initially deformed as the operation plate 10 moves through the magnetic force. Subsequently, when the temporary electrical conduction on the exciting coil 43 stops, the operation plate 10 is pressed back to the original position by the elastic force exerted by the vibrating elastic member 44, which is initially deformed. Subsequently, the operation plate 10 vibrates in the stacking direction by the elastic force exerted by the vibrating elastic member 44 while the vibration amplitude is attenuated.

The exciting coil 43 has one end connected to a positive voltage harness H1, and has another end connected to a ground harness H2. The electrical conduction on the exciting coil 43 is performed through the positive voltage harness H1. Additionally, a detecting harness H3, which is configured to apply a detected voltage, is connected to the movable yoke 41. The detected voltage is ordinarily applied during the operation of the operation apparatus 5 through the detecting harness H3. The detected voltage is set to be smaller than a voltage applied to the exciting coil 43.

When the above-mentioned pressing operation is performed, the electrostatic capacitance C2, which is formed between the fixed yoke 42 and the movable yoke 41, changes as the gap formed between the fixed yoke 42 and the movable yoke 41 gets smaller.

The microcomputer 70 includes a central processing unit (CPU 70a) and a storage device (memory 70b). The CPU 70a functions as an electrode detector 71, a detector 72, a contact determinator 73 and a press determinator 74, which are described in the following, by executing a computing process according to a program stored in the memory 70b (see FIG. 2).

The electrode detector 71 repeats charging and discharging on the electrodes 21 to 26, which form the above-mentioned electrostatic capacitance C1 and counts the number of charging and discharging until meeting a predetermined requirement. As the electrostatic capacitance C1 generated between the electrodes 21 to 26 and the fingertip F is larger, the count value becomes a larger value. Accordingly, the count value is a value that represents the electrostatic capacitance C1 (contact detection value). It is noted that a predetermined voltage (for example, 1V) is applied to the electrodes 21 to 26 during the charging process. The ground electrode 21a is connected to a ground terminal (not shown). The ground electrode 21a inhibits the influence of noise on the signal according to the electrostatic capacitance of the electrodes 21 to 26.

The contact determinator 73 determines that the contact operation is performed when the contact detection value is larger than or equal to a threshold value TH1; and this situation continues for a predetermined time or longer. When it is determined that the contact operation is performed by the contact determinator 73, the microcomputer 70 may change the setting content for the air conditioner 80 that corresponds to the operation surface 11 according to the contact operation. The activation, the setting of the air flow amount, and setting of the temperature for the above-mentioned air conditioner are examples of the setting. The microcomputer 70 outputs a command signal according to the setting to the air conditioner 80, and controls the activation of the air conditioner 80. The microcomputer 70 executes the setting change with regard to the setting content selected by the contact operation. For example, the air flow amount setting or the temperature setting for the air conditioner is changed.

It is noted that the operation apparatus 5 may also operates the audio device 81 or the navigation device 82 other than the air conditioner 80. In this situation, the microcomputer 70 outputs a command signal according to the content set by the operation apparatus 5 to the audio device 81 or the navigation device 82, and controls the activation of the audio device 81 or the navigation device 82.

The voltage application device 76 applies a detected voltage to the movable yoke 41. The detected voltage is set to be equal to the predetermined voltage (for example, 1V) to the electrodes 21 to 26. The voltage application device 76 continues to apply the detected voltage during which the contact operation is performed. The above-mentioned electrostatic capacitance C2 changes when the pressing operation is performed, and a change occurs on the detected voltage applied to the movable yoke 41 along with the change on the electrostatic capacitance C2. The changing amount of the detected voltage is a value (pressing detection value) indicative of the electrostatic capacitance C2. In particular, the gap becomes smaller as the pressing amount gets larger. Accordingly, the pressing detection value gets larger as the electrostatic capacitance C2 becomes larger.

The detector 72 detects the pressing amount caused by the pressing operation. In particular, the detector 72 detects a changing amount of the detected voltage, and outputs the changing amount as the pressing detection value. The press determinator 74 determines that the pressing operation is performed in a situation where the pressing detection value is larger than or equal to a threshold value TH2, and the situation continues for a predetermined time or longer. The vibration controller 75 performs the electrical conduction on the exciting coil 43 during the predetermined time only in a case where the pressing operation is determined by the press determinator 74.

In view of the above description, in the present embodiment, when the change in the electrostatic capacitance formed between the movable yoke 41 and the fixed yoke 42, the pressing amount used in the determination performed by the press determinator 74 is detected. As the pressing amount is detected by detecting a change in the electrostatic capacitance formed between a pair of electrodes, it is not required to provide another electrode only used for detecting the pressing amount. The movable yoke 41 and the fixed yoke 42 included in the vibrator 40 can be functioned as the electrode. Accordingly, the additional electrode used for detecting electrostatic capacitance is not needed so that the vibrating notification function can be provided while inhibiting an increase in the number of components.

Moreover, the present embodiment includes the voltage application device 76 that applies the detected voltage to the movable yoke 41. Accordingly, as the present embodiment is compared with the situation where the detected voltage is applied to the fixed yoke 42, the influence of the exciting coil 43 on the change in the detected voltage can be lessen. Therefore, as the change in the electrostatic capacitance formed between the movable yoke 41 and the fixed yoke 42, the detection accuracy can be improved.

Furthermore, in the present embodiment, the vibrator 40 includes the vibrating elastic member 44, which is initially deformed and then vibrates by the magnetic force through the electrical conduction on the exciting coil 43. Accordingly, when the electrical conduction is temporarily performed on the exciting coil 43, the operation plate 10 vibrates through the vibration of the vibrating elastic member 44 after the electrical conduction. Accordingly, as the present embodiment is compared with the situation where the operation plate 10 vibrates through repetitively turning on and off the electrical conduction on the exciting coil 43, the present embodiment achieves a decrease in a power consumption amount while making the control of electrical conduction simpler.

Second Embodiment

Figure 6:
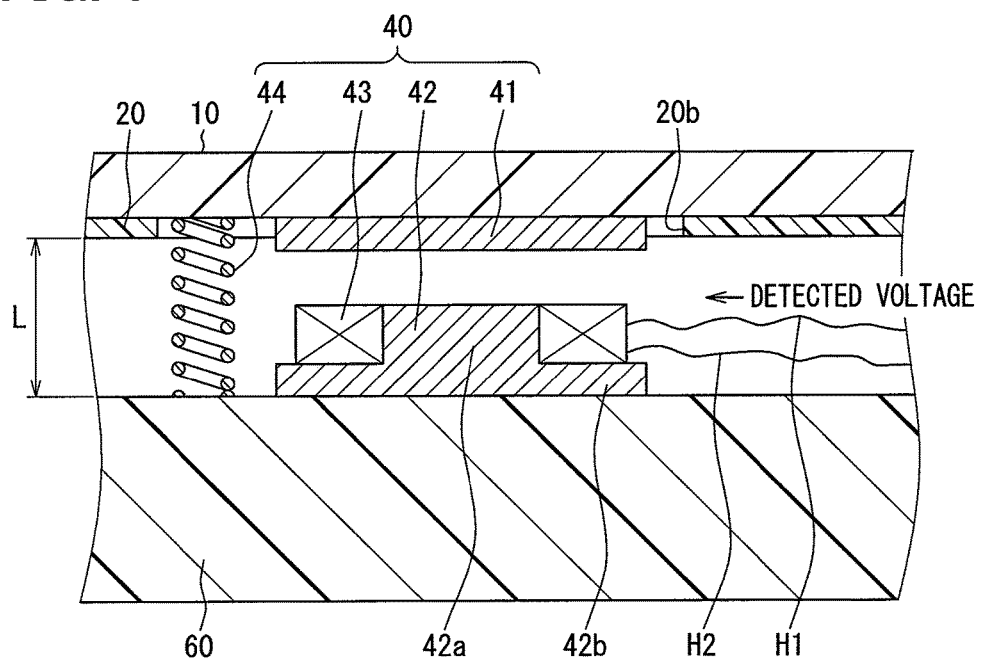
FIG. 6 is a cross sectional view that illustrates an operation apparatus according to the second embodiment.

The voltage application device 76 according to the first embodiment applies a detected voltage to the movable yoke 41, and the detector 72 detects the pressing amount based on the changing amount of the detected voltage. In contrast, the voltage application device 76 according to the present embodiment illustrated in FIG. 6 applies a detected voltage to the exciting coil 43, and the detector 72 detects the pressing amount based on the changing amount of the detected voltage.

In particular, the present embodiment does not include the detecting harness H3 illustrated in FIG. 5, and the voltage application device 76 applies the detected voltage to the exciting coil 43 through the positive voltage harness H1. The detected voltage is set to be smaller than the voltage applied to the exciting coil 43, and is set to be the same as the predetermined voltage (for example, 1V) applied to the electrodes 21 to 26. When the operation apparatus 5 is in operation, the voltage application device 76 ordinarily applies the detected voltage to the exciting coil 43 excluding the period where the vibrator 40 is in vibration.

When the detected voltage is applied to the exciting coil 43 as described above, a magnetic field is generated around the exciting coil 43. When the pressing operation is performed in this situation, a change occurs in the magnetic field so that the inductance of the exciting coil 43 changes due to a change in the magnetic field. Therefore, a change occurs in the detected voltage applied to the exciting coil 43 along with the above-mentioned change. The changing amount of the detected voltage is a value (pressing detection value) indicative of the inductance.

The detector 72, the press determinator 74 and the vibration controller 75 exhibit the functions similar to the above-mentioned first embodiment. In other words, the detector 72 outputs the changing amount of the detected voltage. The press determinator 74 determines that the pressing operation is performed when it is in a situation where the pressing detection value is larger than or equal to the threshold value TH2 and the situation continues for a predetermined time or longer. The vibration controller 75 performs an electrical conduction on the exciting coil 43 for only a predetermined time in a case where the press determinator 74 determines that the pressing operation is performed.

In view of the above description, in the present embodiment, a change in the inductance of the exciting coil 43 included in the vibrator 40 is detected so that the pressing amount used for the determination performed by the press determinator 74 is detected. Accordingly, when the inductive change in the coil is detected and then the pressing amount is detected, the exciting coil 43 included in the vibrator 40 is utilized without having a coil only used for detecting the pressing amount. Therefore, an increase in the number of components can be limited while having the vibrating notification function.

Moreover, the present embodiment utilizes the harness H1 and the harness H2 for supplying vibrating power to the exciting coil 43 to apply the detected voltage to the exciting coil 43. In other words, the harnesses H1 and H2 used for supplying vibrating power are commonly used with the harness for applying the detected voltage. Accordingly, as the present embodiment is compared with the situation where the harness used only for applying the detected voltage, the number of harnesses can be decreased.

Other Embodiments

The above describes the preferred embodiments of the invention, it is to be understood that the disclosure is not limited to the embodiments and constructions. It is possible to carry out various modified examples as described in the following. The present disclosure does not only refer to the combination of the parts, which are explicitly described as to be able to combine with other parts described in each of the embodiments, it is also possible to combine a part of the embodiments to other parts of the embodiments without specifically mentioned in the present disclosure as long as there is no problem occurred in the combination.

In the first and second embodiments, the fixed yoke 42 is configured to be stable at a ground level by grounding the fixed yoke 42. In contrast, the fixed yoke 42 may be set at the floating potential level without grounding the fixed yoke 42.

The vibrator 40 in each of the embodiments includes vibrating elastic member 44, and a magnetic force generated by electrical conduction on the exciting coil 43 is used for initial deformation of the vibrating elastic member 44 and then the vibrating elastic member 44 causes the operation plate 10 to vibrate after the electrical conduction. However, it may be configured such that the movable yoke 41 is caused to be vibrated and then the operation plate 10 is vibrated through the vibration of the movable yoke 41 by repetitively executing to turn on and off of the electrical conduction on the exciting coil 43.

The voltage application device 76 according to the first embodiment applies the detected voltage to the movable yoke 41, and detects a change in the electrostatic capacitance C2 formed between the movable yoke 41 and the fixed yoke 42. However, a change in the electrostatic capacitance C2 may be detected by applying the detected voltage to the fixed yoke 42.

Each of the embodiments includes both of the vibrating elastic member 44 and the pressing elastic member 30. However, one of the members may be eliminated, and another one of the members may be used for both functions. For example, without having the vibrating elastic member 44, the pressing elastic member 30 is initially deformed by a magnetic force through the electrical conduction on the exciting coil 43, and the pressing elastic member 30 causes the operation plate 10 to vibrate after the electrical conduction. Or alternatively, without having the pressing elastic member 30, the operation plate 10 after the pressing operation may be pressed back to the original position, in other words, back to the position where the engaging surface 103a is in contact with the engaging surface 61 by the elastic force of the vibrating elastic member 44 under elastic deformation by the pressing force.

The embodiment illustrated in FIG. 3 shows a configuration in which the electrodes 21 to 26 are held inside the sheet 20a. A configuration in which the electrodes 21 to 26 are printed on the surface of the sheet 20a may also be used instead of the above-mentioned configuration.

In the above-mentioned first embodiment, the first electrodes 21 to 26 used for determination performed by the contact determinator 73 is used for the determination performed by the press determinator 74. However, in the present disclosure, the first electrodes 21 to 26 may also be used in the operation apparatus 5 without having the function of the contact determinator 73.

In each of the above embodiments, the operation plate 10, which is movable in a direction of the pressing operation, is assembled to the assembly member 60. In particular, the engaging part 103 moves into the engaging hole 61. However, when the operation plate 10, which is not movable, is assembled to the assembly member 60, the operation plate is elastically deformed and bent by the pressing operation, and the bending amount may be treated as the pressing operation amount.

The above embodiment assumes that a user operates the operation surfaces 11 to 16 by touching with his or her fingertip F. Hence, the fingertip F is treated as the operation body. However, the user may hold, for example, a pen-like operation member to operate the operation surfaces 11 to 16. In this situation, the operation member other than the human body may also function as the operation body. When the user wears a glove to make a contact operation on the operation surfaces 11 to 16, the glove may be functioned as the operation body.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An operation apparatus comprising:
    an operation plate that includes an operation surface, which is performed by a pressing operation with an operation body;
    a vibrator that includes
        a movable yoke and a fixed yoke that generate a magnetic circuit for guiding a magnetic flux,
        an exciting coil that generates the magnetic flux, and
        a vibrating elastic member that is initially deformed by a magnetic field generated by an electrical conduction on the exciting coil to vibrate the operation plate;
    a detector that detects a pressing amount, which is caused by the pressing operation; and
    a microcomputer configured to
        determine whether the pressing operation is performed based on the pressing amount detected by the detector, and
        perform the electrical conduction on the exciting coil within a predetermined time from when the microcomputer determines that the pressing operation is performed;

wherein the detector detects the pressing amount by detecting a change in an electrostatic capacitance generated between the movable yoke and the fixed yoke.

2. The operation apparatus according to claim 1, further comprising:
a voltage application device that applies a detected voltage to the movable yoke.

3. An operation apparatus comprising:
an operation plate that includes an operation surface, which is performed by a pressing operation through an operation body;
a vibrator that includes
a movable yoke and a fixed yoke that generate a magnetic circuit for guiding a magnetic flux,
an exciting coil that generates the magnetic flux, and
a vibrating elastic member that is initially deformed by a magnetic field generated by an electrical conduction on the exciting coil to vibrate the operation plate;
a detector that detects a pressing amount, which is caused by the pressing operation;
a microcomputer configured to
determine whether the pressing operation is performed based on the pressing amount detected by the detector, and
perform the electrical conduction on the exciting coil within a predetermined time from when the microcomputer determines that the pressing operation is performed; and
a voltage application device that applies a detected voltage to the movable yoke,
wherein the detector detects the pressing amount by detecting a change in an inductance of the exciting coil when the detected voltage is applied.

* * * * *